METHOD OF PRODUCING SCHOTTKY DIODES

Filed Sept. 9. 1971 2 Sheets-Sheet 1

United States Patent Office 3,846,192
Patented Nov. 5, 1974

3,846,192

METHOD OF PRODUCING SCHOTTKY DIODES

Helmuth Murrmann, Munich, Germany, assignor to Siemens Aktiengesellschaft, Munich, Erlangen, and Berlin, Germany Filed Sept. 9, 1971, Ser. No. 178,964
Claims priority, application Germany, Sept. 10, 1970, P 20 44 863.9
Int. Cl. H01l 7/36, 29/48
U.S. Cl. 148—175 3 Claims

ABSTRACT OF THE DISCLOSURE

A method of producing Schottky diodes, which allows the simultaneous production of low-threshold Schottky diodes. To this end, the buried layers are doped at variable thickness with an additional dopant that diffuses during the subsequent thermal process, into the epitactic layer. The method is particularly suited for the production of integrated circuits.

Figure 1:
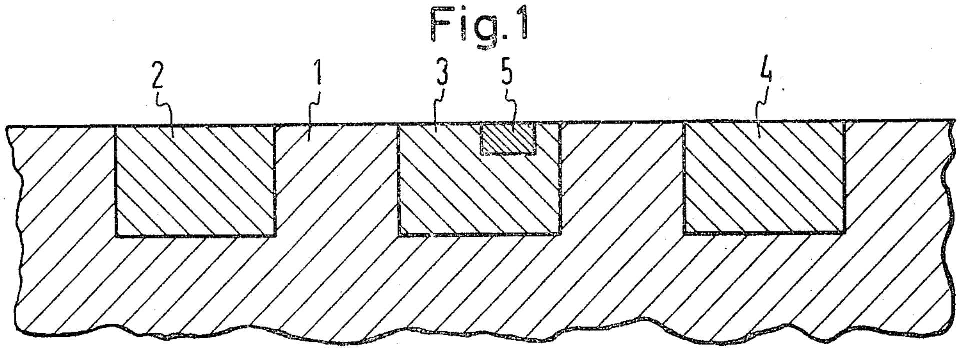

The invention relates to a method of producing Schottky diodes, preferably in an integrated circuit, wherein the semiconductor zone that is adjacent to the junction of the metal contact-semiconductor has dopant concentrations, suitable for the desired electrical properties of the Schottky diode.

The periodical IEEE Transactions on Electron Devices, vol. ED–16, No. 1, January 1969, pp. 58–63, describes a Schottky diode with a metal contact on an epitactic layer. The epitactic layer is positioned on a highly doped substrate, face to face with the metal contact, which consists of molymdenum. The substrate is of the same conductance type as the epitactic layer. An ohmic contact is provided on the surface of the substrate. The edge of the metal semiconductor junctions of the Schottky diode, is enclosed by a highly doped protective ring, in the epitactic layer, in order to avoid disturbing influences. This ring may be produced through diffusion. The ring is of the opposite conductance type to the epitactic layer and the substrate.

Electronics, vol. 42, No. 15, July 21, 1969, pp. 74–80, discloses another Schottky diode where the low ohmic contact of the semiconductor material is positioned on the same side as the Schottky junction. The entire device comprises a p-conducting substrate with an n-conducting layer positioned thereon. Between the n-conducting layer and the p-conducting layer, lies a highly doped n-conducting zone called a "buried layer." The surface of the n-conducting layer contains the Schottky contact and the low ohmic semiconductor contact. To effect electrical isolation of adjacent components, the entire device is enclosed by an isolating wall, which is heavily doped and, which extends from the surface of the semiconductor layer, down to the substrate.

Metal semiconductor, contacts in doped silicon are free of blocking layer, at donor concentrations, which exceed $10^{19}$ foreign atoms/cm.$^3$ These contacts show an ohmic behavior, the remaining potential thresholds between the metal and the semiconductor material are bridged by tunnel effects. At doping concentrations less than $10^{17}$ foreign atoms/cm.$^3$, the behavior of the contacts is determined for n-conducting semiconductor material, by the thermal emission of the metal electrodes at the boundary between the metal and the semiconductor material, and by the potential thresholds. The resultant Schottky contacts have rectifying properties. Doping concentrations, between $10^{17}$ and $10^{19}$ foreign atoms/cm.$^3$, form a junction region between the Schottky contacts and the ohmic contacts.

The dopant concentration of the semiconductor material determines whether the Schottky diode has a low threshold or a high threshold. Low threshold Schottky diodes occur especially in the indicated junction region.

The object of the present invention is to provide a method that permits the simultaneous production of several Schottky diodes with variable electrical properties, in one system. The Schottky diode, produced according to this method, should have low and high threshold voltages and also variable bulk resistances. The method, furthermore, should also be compatible with the conventional processes, used during the production of integrated semiconductor circuits.

To this end, and in accordance with the invention, an additional dopant of one conductance type is installed at such concentration, into a region of a highly doped zone of the one conductance type (buried layer) of a semiconductor substrate of the other conductance type. Following precipitation of a semiconductor layer of one conductance type on the semiconductor substrate, the additional dopant will be partly diffused into the semiconductor layer. As a result, after the production process is completed, the semiconductor zone adjacent the metal contact will have a suitabe dopant concentration.

The invention requires, over the methods known for the production of integrated circuits, only one additional process, namely, the installation of the additional dopant. The variable concentrations of this dopant make it possible to obtain variable surface concentrations at the Schottky contact and, thus, variable properties of the Schottky diodes. This applies to all concentration ranges of the dopant in the semiconductor material below the Schottky contact, where the doping concentration is greater than the basic dopant concentration of the semiconductor layer and smaller than $10^{19}$ foreign/cm.$^3$. The diffused protective rings are required around the Schottky contacts, they can be produced in completely compatibility with the process. It is also preferably to considerably reduce the bulk resistance of the diode, through additional doping.

The doping concentration of the additional dopant is such that, following all thermal processes and considering the thickness of the semiconductor layer, the desired concentration, for example for the production of, low threshold Schottky diodes, is obtained at the system surface.

A further feature of the invention is to diffuse phosphous as the additional dopant within the region of the zone, which is highly doped with arsenic and/antimony. The use of these dopants was found to be particularly preferable.

According to another feature of the invention, the semiconductor layer is epitactically precipitated on the semiconductor substrate. During the diffusion of zones with variable degrees of doping, such as particularly the diffusion of the insulating wall and/or the depth diffusion of the collector, the additional dopant, at least partially, diffuses from the region of the highly doped zone (buried layer), through the epitactically precipitated semiconductor layer, below the provided metal contact. The dopant concentration at the junction between the metal contact and the epitactically precipitated semiconductor layer is determined by the dopant concentration that originally existed in the region of the highly doped zone, and the thickness of the epitactically precipitated semiconductor layer, as well as the intensity of the heat process.

Figure 3:
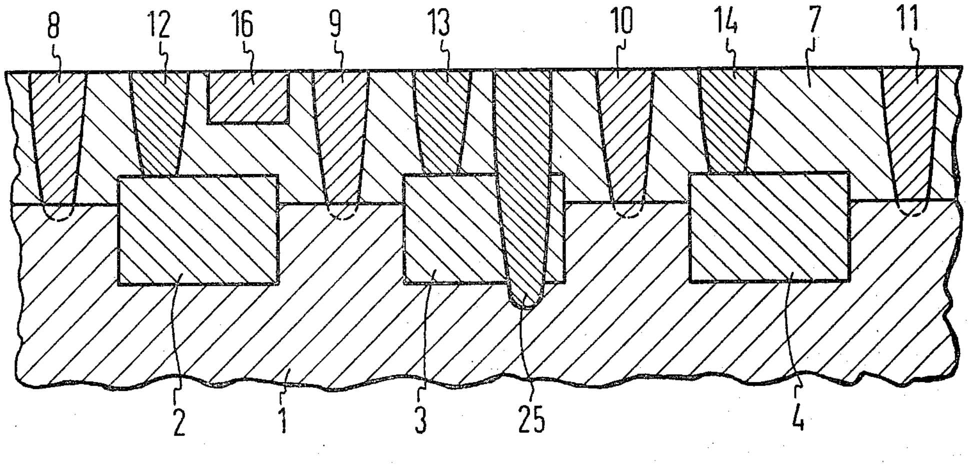
Figure 4:
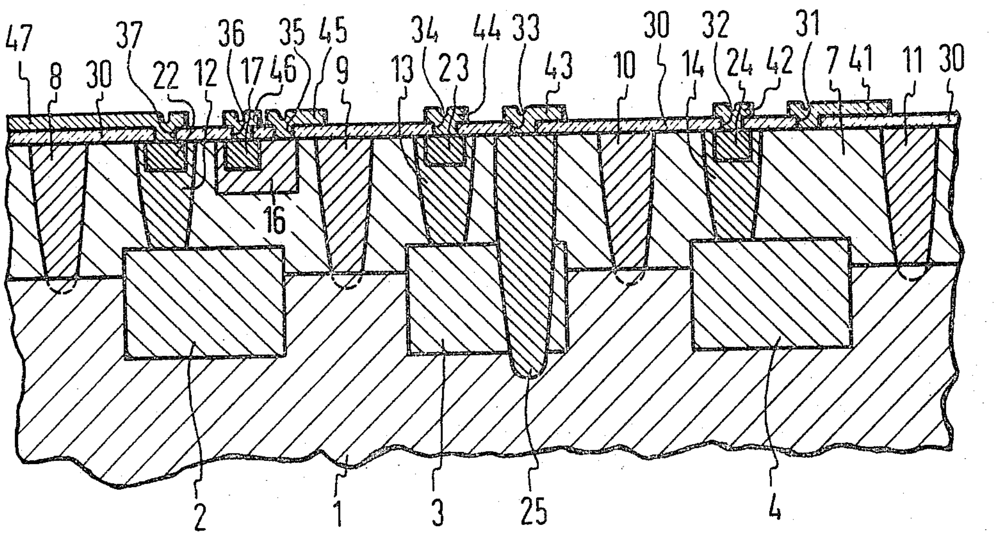
Figure 5:
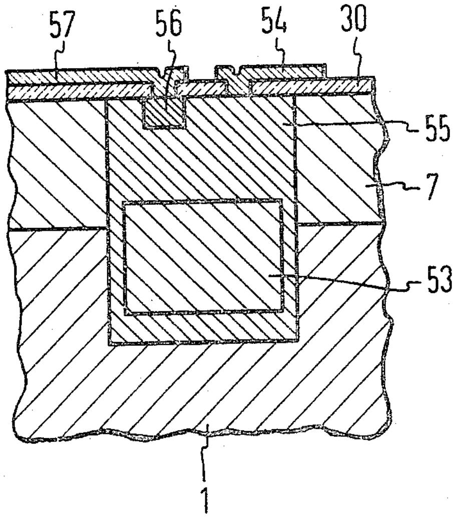
Figure 6:
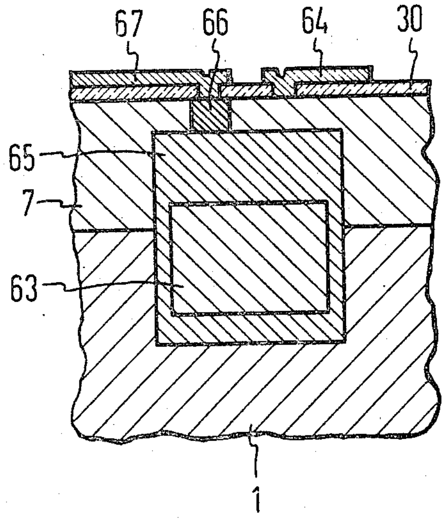

Other details and features of the invention may be derived from the following description of embodiments as shown in the drawing, wherein FIGS. 1 to 4 illustrate sequentially method steps in the production of the Schottky diodes, according to the invention; and FIGS. 5 and 6 illustrate the two other embodiments.

Similar parts are given corresponding reference numerals in the drawings.

In FIG. 1, highly doped $n^+$ conducting zones 2, 3, 4 were diffused into a semiconductor substrate 1. This was done according to planar technology. For the sake of better clarity, the silicon diode layers were omitted in FIGS. 1 to 3. Arsenic or antimony were used as dopants. Substrate 1 was p-conductive. Zones 2, 3, 4 were situated at localities where low bulk resistances are required. This applies to transistors, p-n diodes and possibly also to Schottky diodes. Zones 2, 3, 4 were also designated as buried layers. Region 5, doped with phosphorus, was diffused into zone 3. Region 5 had a doping concentration appropriately selected for a subsequent low threshold Schottky diode (FIG. 1).

Figure 2:
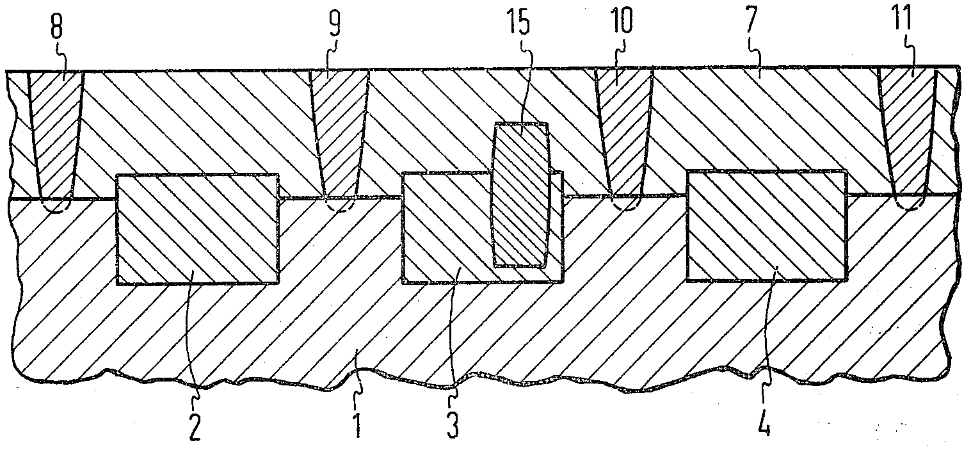

In FIG. 2, an n-conducting semiconductor layer 7 was epitactically precipitated upon the surface of the object of FIG. 1. The specific resistance of this semiconductor layer 7 was, for example, 0.8Ω cm., and its thickness was 4 μm. Subsequently, various isolation walls 8, 9, 10, 11 were diffused into the semiconductor layer 7 for the electrical isolation of individual semconductor regions and extend down to substrate 1. The isolating walls 8, 9, 10, 11 were heavily doped with boron. During this process step, the phosphorus dopant diffused partially from region 5 into the semiconductor layer 7 and into zone 3, thus forming a phosphorus doped region 15. At the same time, the zones 22, 3, 4 also grew somewhat into the semiconductor layer 7.

In FIG. 3, highly doped zones 12, 13, 14 were diffused into the semiconductor layer 7 to reduce the bulk resistances. Zones 12, 13, 14 are doped with phosphorus and extend down to zones 2, 3, 4. This method step is called "collector deep diffusion" and is provided, primarily for subsequent transistors or diodes. A p-conductive region 16 was diffused into the tub defined by the isolation walls 8, 9 and the substrate 1. Region 16 was provided as a base for a later transistor, situated in said tub. Simultaneously with the collector deep diffusion, the dopant phosphorus continued to diffuse from region 16 into the semiconductor layer 7 and the substrate 1, thus forming phosphorus doped region 25, which now extends up to the surface of the system. The diffusion for a resistor may be carried out simultaneously with the base diffusion (region 16). This is not shown in the figures, however, for better clarity.

Finally, as seen in FIG. 4, the emitter diffusion for the transistors took place and the preparation for ohmic contacts was effected on semiconductor layer 7. To this end, an n-doped region 17, which functions as an emitter, was installed into region 16. Regions 16, 17 and the part of the semiconductor layer 7, situated between the isolation walls 8, 9 define a transistor. Furthermore, highly doped n-conductive regions 22, 23, 24 were diffused into zones 12, 13, 14. Regions 22, 23, 24 form the necessary ohmic contacts. Region 22 is the collector connection of the transistor while regions 23, 24 are the second connections of the subsequent Schottky diodes. Following the conclusion of all processes, the surface was covered with an isolating silicon dioxide layer 30. Contact holes 31, 32, 33, 34, 35, 36, 37 were etched into the silicon dioxide layer 30. The metal layer was partly etched off so that the desired conductor paths or contact structures, may be developed. Finally, the individual contacts were simultaneously formed through alloying or sintering of all contact localities. The contact layer 41, in contact hole 31 together with the semiconductor layer 7, is a high threshold Schottky diode. The metal layer 42 in contact hole 32, serves as an electrical connection for the semiconductor region of this Schottky diode. Metal layer 43 together with region 25, in contact hole 33, forms a low threshold Schottky diode. The second connection for this Schottky diode is the metal layer 44, in contact hole 34. The metal layer 45 defines the base connection, metal layer 46 the emitter connection and metal layer 47 defines the collector connection of the transistor, situated between the isolation walls 8, 9.

As shown in this embodiment, the invention provides for the simultaneous production of a low threshold Schottky diode, a high threshold Schottky diode and another semiconductor component, for example, a transistor.

The method of the invention is, particularly, suitable for the production of Schottky diodes in integrated circuits. FIGS. 5 and 6 show two other embodiments for integrated Schottky diodes.

FIG. 5 shows a low threshold Schottky diode with an extremely low bulk resistance. The Schottky contact of this diode, was formed through the metal layer 54 and through region 55. Region 55 corresponds to region 25 of the embodiment example and was produced, accordingly. To this end, the n-conducting region 53 which serves as a buried layer, was in addition intensively doped with phosphorus. The dopant phosphorus, during the subsequent thermal processes, diffused into the semiconductor layer 7 and the substrate 1 to finally form region 55. A highly doped, n-conducting zone 56, with metal layer 57 was provided as a second ohmic connection for the Schottky diode.

In FIG. 6, a high threshold Schottky diode with low bulk resistance is illustrated. The Schottky contact is formed by metal layer 64 and the semiconductor layer 7. The highly doped n-conducting zone 66 and the metal layer 67 serves as a second connection. The substrate 1 and the semiconductor layer 7 are p-or n-doped as in FIG. 5. The zone 63 serving as a buried layer, is n-doped just as zone 53. Contrary, however, to region 55 of FIG. 5, the n-doped region 56, in the embodiment of FIG. 6, does not extend up to the metal layer 64. This is a result of the fact that zone 63 was not doped as strongly with the additional dopant phosphorus as in the embodiment of FIG. 5. Because of this, the additional dopant did not diffuse, during the subsequent thermal processes, entirely up to the surface of the system. Since the semiconductor layer 7 was doped less than region 65 or 25, 55, respectively, in the embodiments of FIGS. 4 and 5, obtained through additional doping, the contact between the metal layer 64 and the semiconductor layer 7 has a high threshold. At the same time, the Schottky diode illustrated in FIG. 6 has a low bulk resistance, due to region 65.

What is claimed is:

1. A method for producing high and low threshold Schottky diodes in an integrated circuit, comprising diffusing a plurality of n-conducting zones highly doped with one of the group including arsenic or antimony into a p-conductive semiconductor substrate, diffusing a phosphorous doped region into one of the zones, epitaxially precipitating a n-conducting semiconductor layer over the surface of the substrate into which the n-conducting zones have been diffused, diffusing the phosphorus doped region into the layer up to the surface of the layer and arranging a metal contact on the surface of the layer in contact with the phosphorous dopant in the layer diffusing through the layer a second phosphorus doped region down to said one zone and a third phosphorus doped region down to a second of the zones, diffusing respective highly doped n-conductive regions into each of the second and third phosphorous doped regions, arranging respective metal contacts on the layer in contact with each of the n-conductive regions and arranging a metal contact on the layer above the second zone, the layer and the metal contacts arranged thereabove forming high and low threshold Schottky diodes and the metal contacts in contact with the n-conductive regions forming the other electrical connections of the respective Schottky diodes.

2. Method according to claim 1 for simultaneously producing a transistor with the high and low threshold Schottky diodes further comprising diffusing through the layer a fourth phosphorus doped region down to a third of the zones, diffusing a p-conductive region into the layer above the second zone, diffusing a n-conductive region into the p-conductive region, diffusing a highly doped n-conductive region into the fourth phosphorous doped region and arranging respective metal contacts on the layer in contact with each of the n-conductive regions, the other n-conductive regions together with the p-conductive region comprising a transistor and the other metal contacts comprising respective base, emitter and collector connections for the transistor.

3. Method according to claim 1 for simultaneously producing a high threshold Schottky diode with a low threshold Schottky diode, further comprising diffusing into said semiconductor layer, a plurality of isolation walls for the electrical isolation of individual semiconductor regions, said isolation walls extending down to said substrate.

References Cited

UNITED STATES PATENTS

| | | | |
|---|---|---|---|
| 3,427,513 | 2/1969 | Hilbiber | 317—235 |
| 3,646,411 | 2/1972 | Iwasa | 317—235 |
| 3,585,464 | 6/1971 | Castrucci et al. | 148—175 X |
| 3,506,893 | 4/1970 | Dhaka | 317—235 |
| 3,340,598 | 9/1967 | Hatcher | 29—571 |
| 3,463,975 | 8/1969 | Biard | 317—235 |
| 3,540,010 | 11/1970 | Heightley et al. | 317—235 UX |
| 3,568,011 | 3/1971 | Iwasa | 317—234 |
| 3,611,067 | 10/1971 | Oberlin et al. | 317—235 |

OTHER REFERENCES

Hilbiber, D. F.: "High Performance Lateral . . . Integrated Circuits," Trans. Electron Devices, vol. ED–14, No. 7, July 1967, pp. 381–385.

Gaensslen et al.: "FET Memory Cell Using Schottky Diodes . . . Devices," IBM Tech. Discl. Bull., vol. 13, No. 2, July 1970, pp. 302–303.

Noyce, R. N. et al.: "Schottky Diodes Make IC Scene," Electronics, vol. 42, No. 15, July 1969, pp. 74–80.

Frederiksen et al.: "Transistor Advances," Motorola Monitor, vol. 8, No. 1, April 1970, pp. 24–25.

L. DEWAYNE RUTLEDGE, Primary Examiner

W. G. SABA, Assistant Examiner

U.S. Cl. X.R.

29—569, 577; 117—201, 217; 148—187, 191; 357—15, 40, 48